Jan. 9, 1973 JUNZI SATO ET AL 3,709,749

METHOD OF ETCHING INSULATING FILMS

Filed Nov. 24, 1970 5 Sheets-Sheet 1

United States Patent Office 3,709,749
Patented Jan. 9, 1973

3,709,749

METHOD OF ETCHING INSULATING FILMS

Junzi Sato, Yokohama, and Takako Tanabe, Kawasaki, Japan, assignors to Fujitsu Limited, Kawasaki, Japan Filed Nov. 24, 1970, Ser. No. 92,379
Claims priority, application Japan, Dec. 1, 1969, 44/96,403
Int. Cl. H01l *7/50;* C23f *17/00*
U.S. Cl. 156—11 1 Claim

ABSTRACT OF THE DISCLOSURE

A method of etching insulating film wherein a substrate having a silicon nitride film or a silicon oxide film is dipped in high temperature water of above 100° C.

Our invention relates to a method of etching a silicon nitride film or a silicon dioxide film. The invention also provdies a method of selectively etching a silicon nitride film.

Silicon dioxide films and silicon nitride films are widely used as diffusion masks, passivating films or insulating films for multilayer wiring in the manufacture of semiconductor devices. The art of etching these films is an important art in the manufacture of semiconductor devices.

According to the conventional method, silicon dioxide is etched by hydrofluoric acid or potassium hydroxide while silicon nitride is etched by phosphoric acid. Silicon nitride is selectively etched by phosphoric acid or ethylene glycol in which acid ammonium fluoride has been dissolved using silicon dioxide as a mask. It is also possible to selectively etch silicon nitride by hydrofluoric acid and by the use of silicon or a metal as a mask. It is also well known to selectively etch silicon nitride by firstly anodically oxidizing the silicon nitride using silicon dioxide as a mask and then etching the oxidized silicon nitride by hydrofluoric acid. However, etching liquids other than that using acid ammonium fluoride as the solute are all aqueous solutions. In aqueous solutions the pH must be controlled strictly, moreover, various conditions are required in the preparation of the solutions and in the temperature under which the solutions are used. The most generally used method of selectively etching silicon nitride is to etch the silicon nitride by phosphoric acid using a silicon dioxide mask, but it is impossible, in this method, to completely avoid the etching of the silicon dioxide. Even under the best conditions, silicon dioxide has an etching rate equal to 1/10 of the etching rate of silicon nitride and it is difficult to etch correctly and selectively silicon nitride in this method as in the other method. When there is a silicon dioxide layer under a silicon nitride film, the silicon dioxide is over-etched, so that much care must be taken in the etching time.

It is an object of this invention to provide an insulating film etching method eliminating the various regulations applied to the conventional etching method and capable of selectively etching silicon nitride and silicon dioxide with high precision.

Another object of the invention is to provide an insulating film etching method capable of selectively etching silicon nitride with greater simplicity.

These objects can be achieved by dipping a substrate provided with a silicon nitride film or a silicon dioxide film in a high temperature water of above 100° C. and by dipping a substrate provided with a silicon nitride film selectively coated with a film of silicon dioxide, silicon, chromium, platinum, gold, titanium or molybdenum in a high temperature water of above 100° C. and removing the silicon nitride film selectively.

The invention will be briefly explained and then embodiments thereof will be described. As described above, a substrate provided with a silicon nitride film or a silicon dioxide film is dipped in high temperature water of above 100° C. The high temperature water of above 100° C. can be obtained by, for example, heating water in a tightly closed autoclave. The high temperature water can also be obtained by heating water in an autoclave heated by high pressure gas sent to the autoclave from a compressor. The silicon nitride or the silicon dioxide is etched within this high temperature water. This exceeds the conventional concept of the etching liquid. In many of the conventional etching liquids, water is used as the solvent and a material for etching the film, i.e. the etchant which is the solute is solved in the water whereas, according to the present invention, the etching liquid consists of only water as etchant. We have found that although silicon nitride is not oxidized by steam under 1000° C. under the normal pressure, it can readily be etched within a high temperature water, i.e. under a pressure. Pure water can be used and the inner wall of an autoclave made of stainless steel is not eroded. Silicon dioxide can be etched in the same manner as silicon nitride, but the etching rate of silicon dioxide is sufficiently small compared with the etching rate of silicon nitride. It can be considered that silicon nitride is decomposed by reacting, as shown in the following formula:

$$Si_3N_4+12H_2O \rightarrow 4NH_3\uparrow+3Si(OH)_4$$

Silicon dioxide can be used as a mask in the selective etching of silicon nitride because, as described above, the etching rate of silicon dioxide is sufficiently small compared with the etching rate of silicon nitride. In many of semiconductor devices, a silicon dioxide layer is provided under silicon nitride but the possibility of over-etching this silicon dioxide can be reduced. Similarly, silicon, chromium, platinum, gold, titanium, and molybdenum can be used as a mask in the selective etching of silicon nitride as these metals are stable within high temperature water. These metals can also be used as a mask for silicon dioxide, if it is necessary.

According to this invention, the etching of silicon nitride and silicon dioxide and the selective etching of silicon nitride can be undertaken within high temperature water so that the films can be etched with ease. In the conventional etching method using etching liquid, it is necessary to regulate the pH and strictly control the etching time and the etching temperature but such need for the control can be eliminated according to this invention. Therefore the etching rate and temperature in this invention can be arbitrarily controlled by the pressure and heating conditions. Further, windows can be opened with a high precision as silicon dioxide is not overetched.

Figures 1, 2, 3:
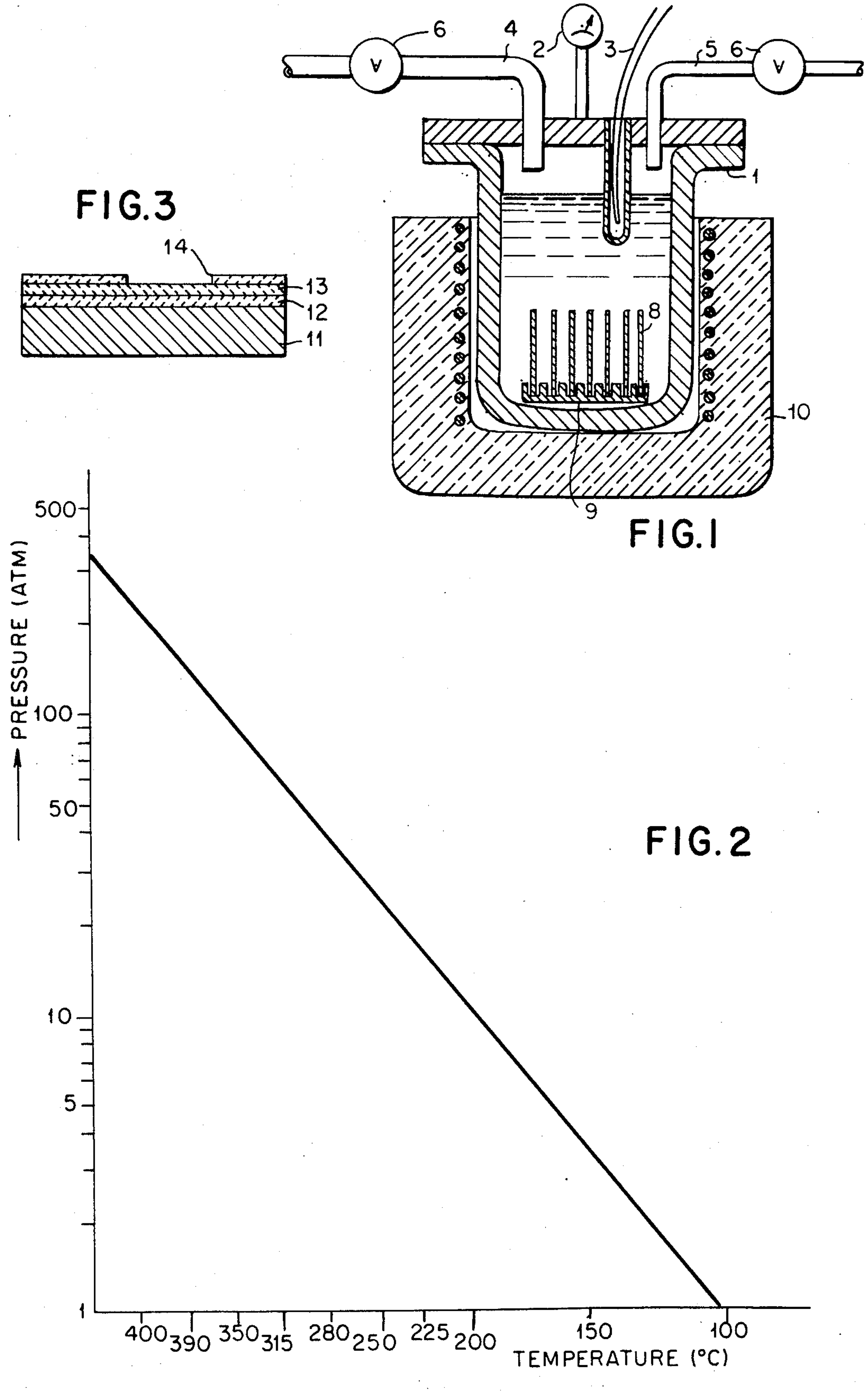
FIG. 1 is a sectional view showing an embodiment of apparatus used for carrying out the invention.
FIG. 2 shows the relationship between the pressure and temperature in the autoclave of FIG. 1.
FIG. 3 is a sectional view of a body showing a silicon dioxide layer selectively removed.

Several embodiments of this invention will now be described with respect to the drawing.

In FIG. 1, 1 is a stainless steel autoclave to which pressure gauge 2 and thermometer 3 can be attached. Further, high pressure gas inlet 4 and outlet 5, controlled by valves 6, are connected to autoclave 1. Pure water 7 and holder 9, with samples 8, are placed in autoclave 1. The pure water 7 is heated by electric furnace 10. When the lid of autoclave 1 is closed, valves 6 are closed and autoclave 1 is heated by electric furnace 10, the water in autoclave 1 is evaporated and the interval pressure is raised. The relationship between the water temperature and the vapor pressure within the autoclave is as shown in FIG. 2.

In FIG. 2, the pressure in atmosphere is on the ordinate with the temperature in ° C. on the abscissa. Samples 8 can be manufactured in the following manner. A silicon substrate is placed into a gaseous phase growth furnace. The substrate is first thermally oxidized at 1200° C. to form a silicon dioxide film. A silicon nitride film is then grown on said thermally grown silicon dioxide film at 950° C. by gaseous phase reaction of monosilane and ammonia. Silicon dioxide, in turn, is grown on the silicon nitride film at 850° C. by the gaseous phase reaction of monosilane and oxygen. Then silicon dioxide is removed selectively as shown in FIG. 3 by photoetching. In the photoetching, a buffer solution of hydrofluoric acid and ammonium fluoride can be used as the etching liquid.

In FIG. 3, which is a sectional view of a sample used in the present embodiment, 11 is the silicon substrate, 12 is the thermally grown silicon dioxide film 13, is the silicon nitride film and 14 is the second silicon dioxide film.

Figure 4:
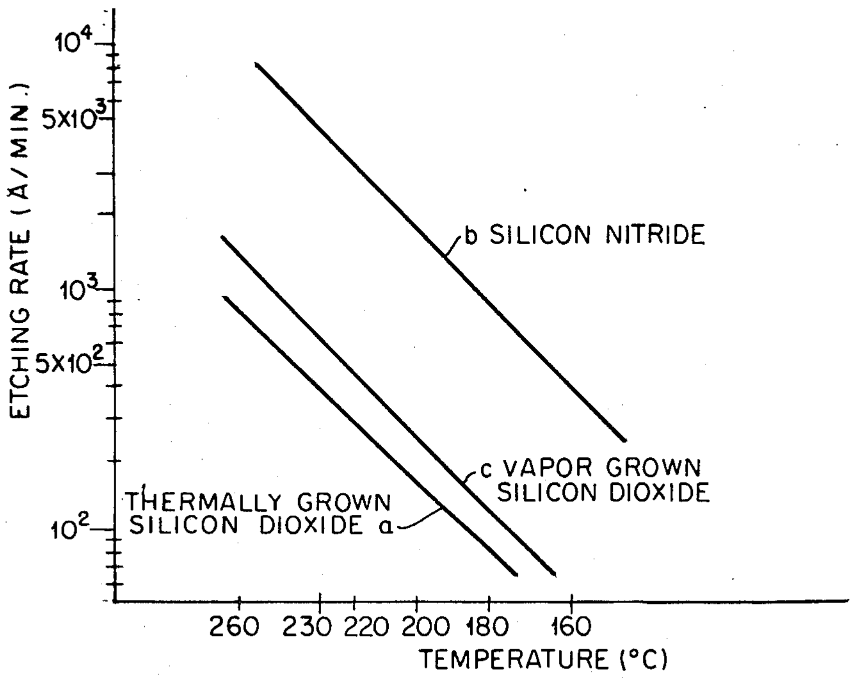
FIG. 4 shows the relationship between the temperature and etching rates of films.

The autoclave 1 is heated by electric furnace 10 as described above and when 100° C. is arrived at, silicon nitride has an etching rate of several A./min. The relation between the temperature and the etching rates of the films is shown in FIG. 4 with the etching rate on the ordinate and the temperature on the abscissa. Curve *a* shows a thermally grown silicon dioxide film 12, curve *b* shows silicon nitride film 13 and curve C shows vapor grown silicon dioxide film. The silicon substrate is also slightly etched during the above-mentioned etching of the films within the high temperature water but the etching of the silicon substrate is almost negligible.

In the embodiment of this invention described above, the high temperature water was obtained by closing valve 6 and heating autoclave 1 by electric furnace 10 but it is also possible where necessary to open the valves 6 and send in high pressure gas. It is advantageous from the practical viewpoint to make the temperature of the high temperature water above 180° C. so that the silicon nitride may have an etching rate of above 1000 A./min. but the greatest lower temperature limit of the high temperature water in this invention is 100° C.

As is seen from FIG. 4, the silicon nitride film has an etching rate of $2\times10^3$ A./min. when the temperature of the water is 200° C. and the vapor grown silicon dioxide film has an etching rate of $2.5\times10^2$ A./min., so that the silicon nitride film can be etched selectively by the use of silicon dioxide as the mask. It has been found by the similar experiment that aluminum is etched with an etching rate of about 6000 A./min. within a high temperature water of 200° C. but chromium, platinum, gold, titanium and molybdenum are not etched in the same high temperature water. Therefore silicon nitride can be etched selectively by the use of a silicon, chromium, platinum, gold, titanium or molybdenum film as the mask. In the embodiment of this invention described above, a pure water of the pH of about 7 was used. The etching rate of a film was changed by varying the pH of the water under the normal temperature by adding acid or alkali to the pure water.

Figure 5:
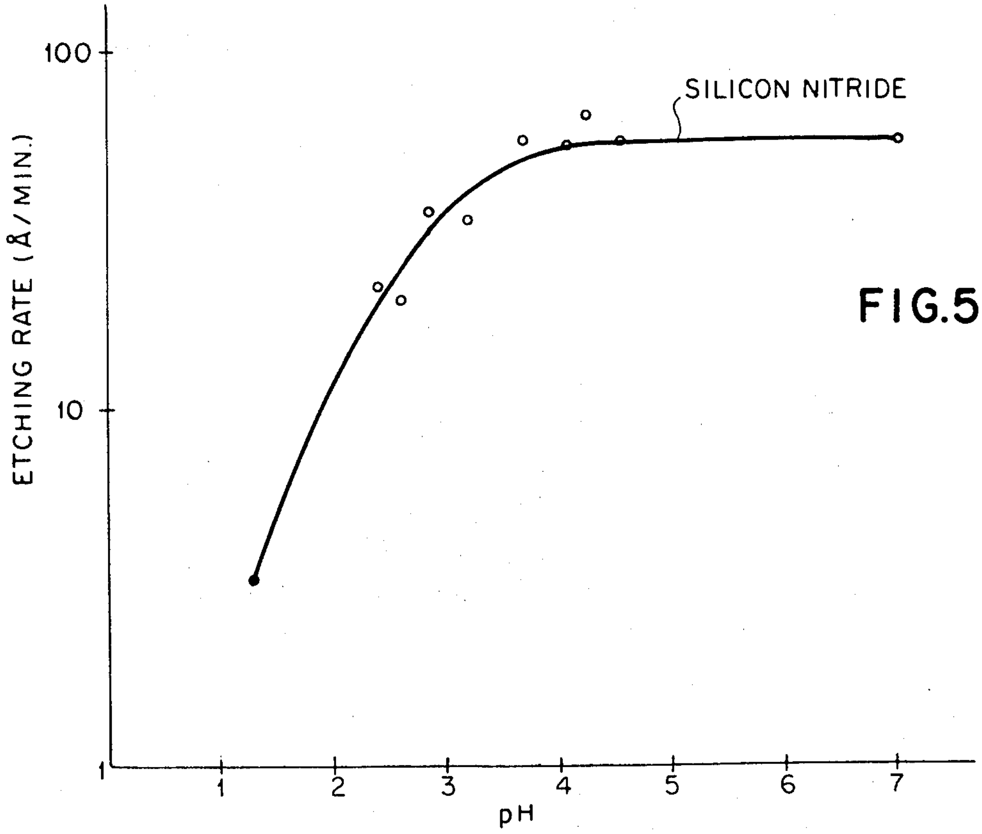
FIG. 5 shows the etching rate of silicon nitride and the thermally oxidized film in water at low pH.

FIG. 5 shows the etching rate (on ordinate) of silicon nitride within a water, the pH (on abscissa) of which has been changed by the addition of hydrogen chloride. The only difference between the first embodiment and this second embodiment is that the temperature of the water in the second embodiment is 180° C., and in both of the two embodiments the measurement was made in completely the same manner. As seen from FIG. 5, the thermally grown silicon dioxide film has an etching rate so small that it cannot be measured.

Figure 6:
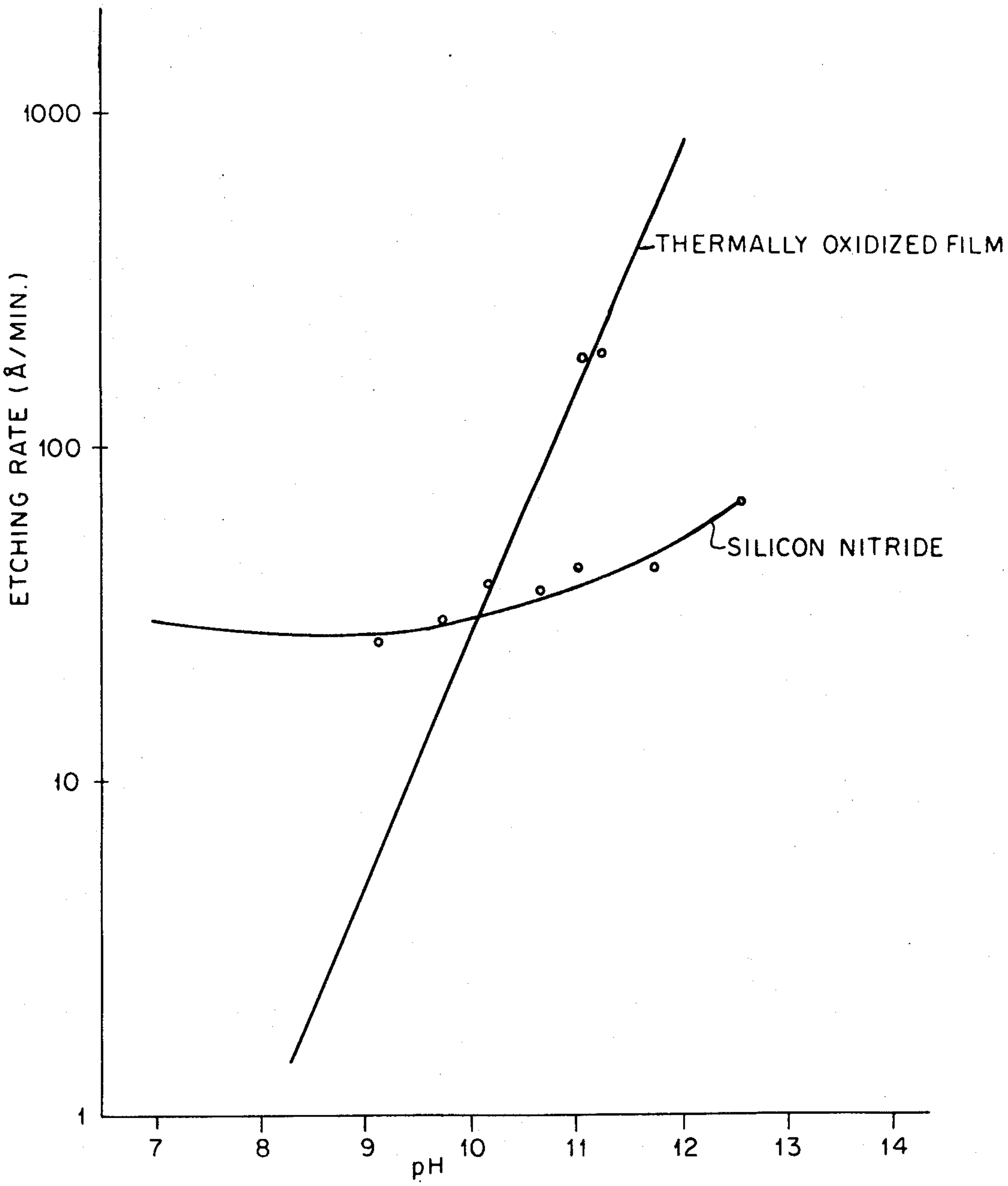
FIG. 6 shows the etching rate of silicon nitride and the thermally oxidized film in water at high pH.

FIG. 6 is similar to FIG. 5 and shows the change of etching rate in a water to which sodium hydroxide has been added. In the case of FIG. 6, the temperature of the water is set to 160° C. In this embodiment, at a pH of about 10, the etching rate of siilcon nitride and the etching rate of the thermally grown silicon dioxide film are reversed. When the pH is above about 9, it is impossible to selectively etch the silicon nitride by using an oxide film as the mask. As evident from FIGS. 5 and 6, the etching rate of silicon nitride is constant when the pH is within a wide range of about 7.

Figure 7:
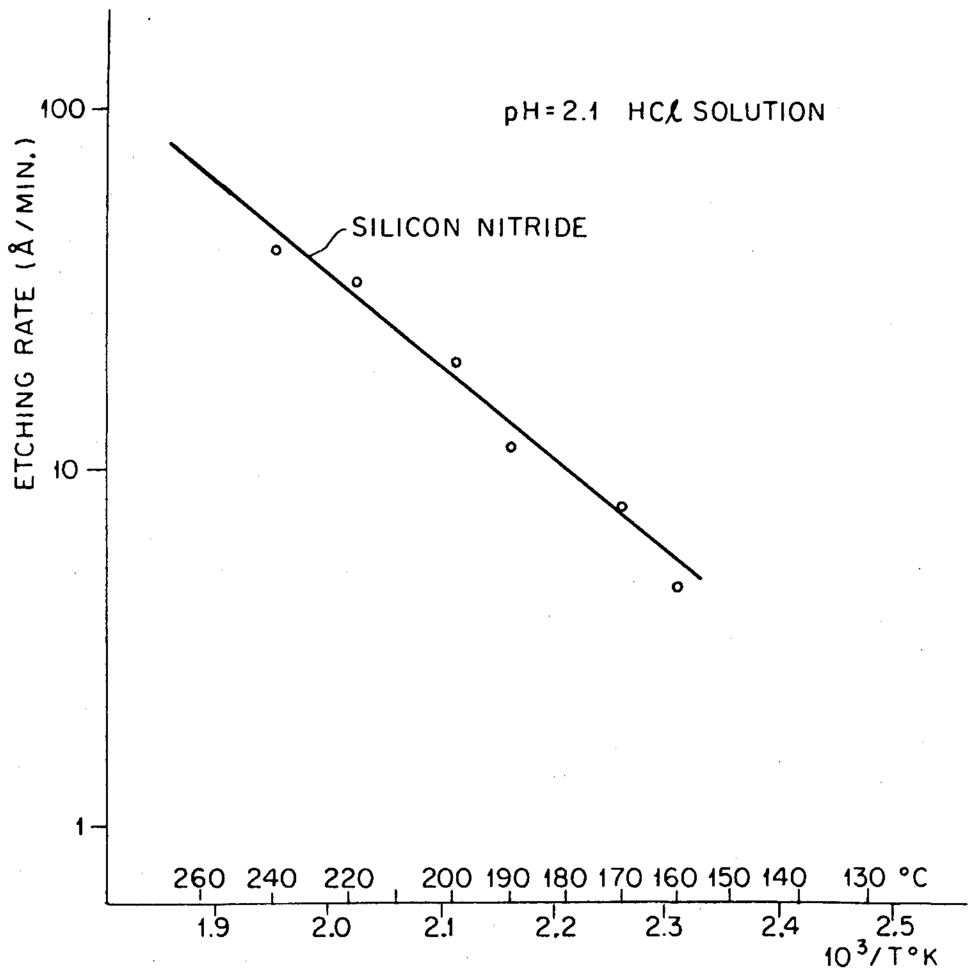
FIG. 7 shows the relation between the temperature and the etching rate of silicon nitride in water at pH 2.1.

FIG. 7 shows the relationship between the temperature and the etching rate of silicon nitride in a water to which hydrogen chloride has been added at a pH of 2.1.

Figure 8:
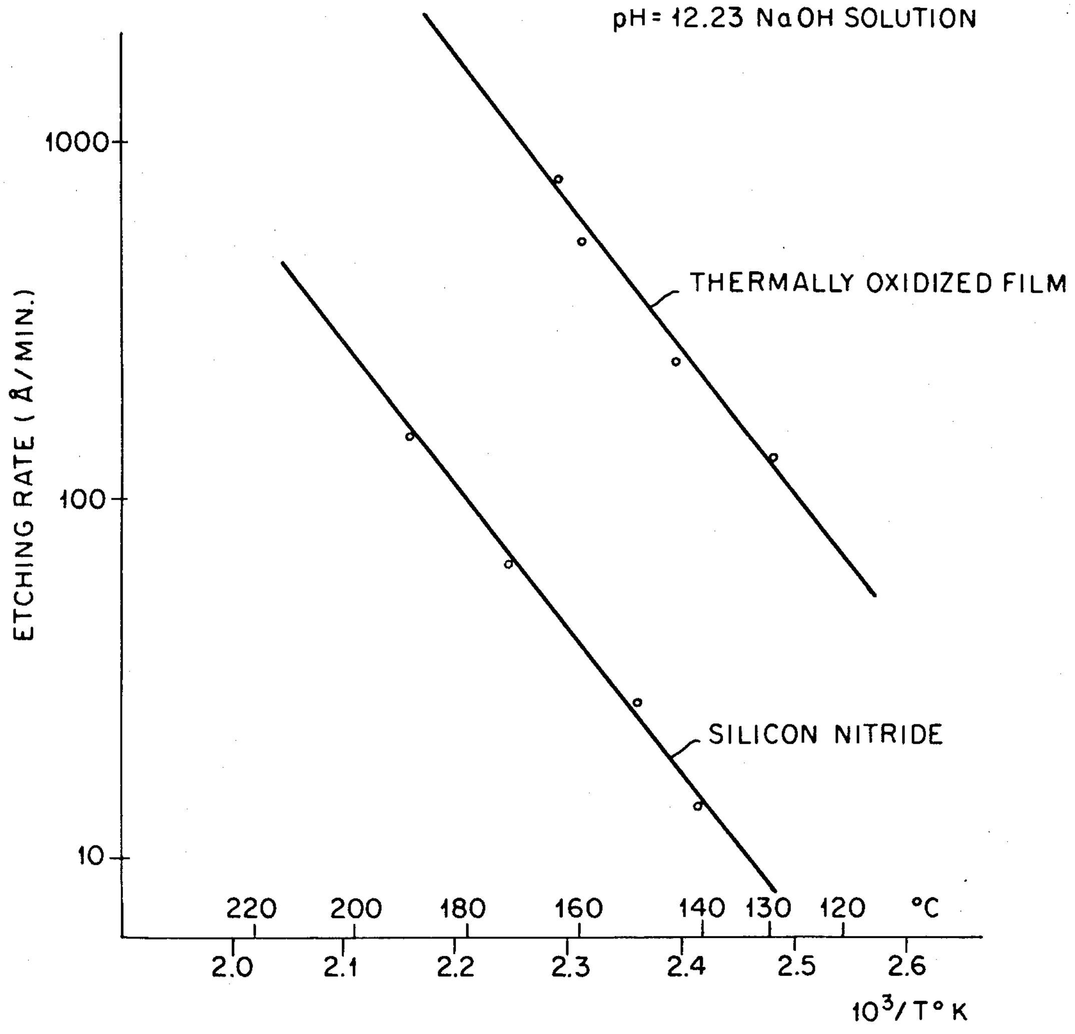
FIG. 8 shows the relation between the temperature and the etching rate of silicon nitride in water at pH 12.23.

FIG. 8 shows the relationship between the temperature and the etching rate of silicon nitride and the etching rate of the thermally grown oxide film in a water to which sodium hydroxide has been added at a pH of 12.23.

High temperature water may also be called superheated water.

We claim:

1. An insulating film etching method which comprises providing a substrate with a silicon nitride film thereon, coating said silicon nitride film with a silicon doxide film, cutting windows through said silicon dioxide film to expose the silicon nitride film and etching said exposed silicon nitride film by superheated water above 180° C. at a pH below 10.

References Cited

UNITED STATES PATENTS 2,916,407 12/1959 Buck et al. ---------- 134—30

J. H. STEINBERG, Primary Examiner

U.S. Cl. X.R.

23—356; 134—2; 156—13, 17